(12) United States Patent
Xu

(10) Patent No.: US 8,895,426 B2
(45) Date of Patent: Nov. 25, 2014

(54) METAL GATE TRANSISTOR, INTEGRATED CIRCUITS, SYSTEMS, AND FABRICATION METHODS THEREOF

(75) Inventor: Jeff J. Xu, Jhubei (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 981 days.

(21) Appl. No.: 12/784,073

(22) Filed: May 20, 2010

(65) Prior Publication Data
US 2010/0314687 A1 Dec. 16, 2010

Related U.S. Application Data

(60) Provisional application No. 61/186,628, filed on Jun. 12, 2009.

(51) Int. Cl.
| | |
|---|---|
| H01L 21/3205 | (2006.01) |
| H01L 21/4763 | (2006.01) |
| H01L 21/8238 | (2006.01) |
| H01L 29/49 | (2006.01) |
| H01L 27/092 | (2006.01) |
| H01L 21/28 | (2006.01) |
| H01L 29/66 | (2006.01) |
| H01L 29/78 | (2006.01) |

(52) U.S. Cl.
CPC .... *H01L 21/823842* (2013.01); *H01L 29/4966* (2013.01); *H01L 27/092* (2013.01); *H01L 21/28088* (2013.01); *H01L 29/66545* (2013.01); *H01L 21/823835* (2013.01); *H01L 29/7833* (2013.01); *H01L 29/66583* (2013.01)
USPC ............ 438/592; 438/682; 438/721; 438/755

(58) Field of Classification Search
None
See application file for complete search history.

(56) References Cited

U.S. PATENT DOCUMENTS

| | | | |
|---|---|---|---|
| 5,135,882 A | 8/1992 | Karniewicz | |
| 6,238,958 B1 * | 5/2001 | Hsu et al. | 438/163 |
| 6,410,376 B1 * | 6/2002 | Ng et al. | 438/199 |
| 6,573,134 B2 | 6/2003 | Ma et al. | |
| 2005/0045965 A1 | 3/2005 | Lin et al. | |
| 2005/0275039 A1 * | 12/2005 | Nakajima | 257/388 |
| 2006/0105515 A1 | 5/2006 | Amos et al. | |
| 2007/0040225 A1 | 2/2007 | Yang | |
| 2008/0023774 A1 * | 1/2008 | Sato et al. | 257/384 |
| 2008/0029822 A1 | 2/2008 | Tsuchiya et al. | |
| 2008/0132070 A1 * | 6/2008 | Li et al. | 438/682 |
| 2008/0164529 A1 | 7/2008 | Lin et al. | |
| 2009/0321843 A1 | 12/2009 | Waite et al. | |
| 2010/0270627 A1 * | 10/2010 | Chang et al. | 257/411 |

* cited by examiner

*Primary Examiner* — Thien F Tran
(74) *Attorney, Agent, or Firm* — Lowe Hauptman & Ham, LLP

(57) ABSTRACT

A gate-last method for forming a metal gate transistor is provided. The method includes forming an opening within a dielectric material over a substrate. A gate dielectric structure is formed within the opening and over the substrate. A work function metallic layer is formed within the opening and over the gate dielectric structure. A silicide structure is formed over the work function metallic layer.

20 Claims, 14 Drawing Sheets

METAL GATE TRANSISTOR, INTEGRATED CIRCUITS, SYSTEMS, AND FABRICATION METHODS THEREOF

CROSS-REFERENCE TO RELATED APPLICATIONS

The present application claims priority of U.S. Provisional Patent Application Ser. No. 61/186,628, filed on Jun. 12, 2009, which is incorporated herein by reference in its entirety.

TECHNICAL FIELD

The present disclosure relates generally to the field of semiconductor devices, and more particularly, to metal gate transistors, integrated circuits, systems, and fabrication methods thereof.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices.

During the scaling trend, various materials have been implemented for the gate electrode and gate dielectric for CMOS devices. CMOS devices have typically been formed with a gate oxide and polysilicon gate electrode. There has been a desire to replace the gate oxide and polysilicon gate electrode with a high dielectric constant (high-k) gate dielectric and metal gate electrode to improve device performance as feature sizes continue to decrease.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
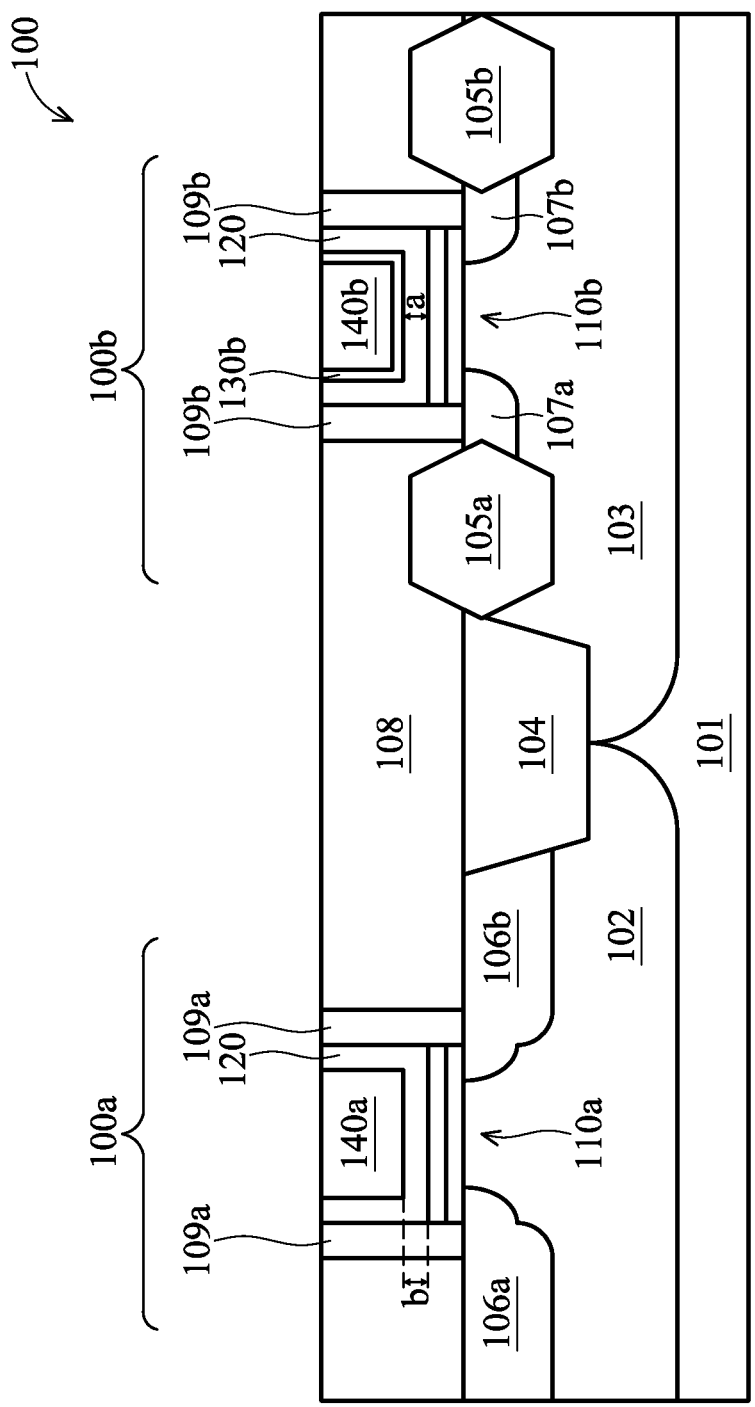
FIG. 1 is a schematic cross-sectional view illustrating an exemplary integrated circuit including a P-type transistor and an N-type transistor.

Conventionally, techniques for forming the metal gate electrode can be cataloged as gate-first processes and gate-last processes. For a gate-first process, the metal gate electrode is formed before formation of source/drain regions of the transistors. A gate-last process forms the source/drain regions within the substrate and a dummy gate within an interlayer dielectric (ILD). The dummy gate is removed and an opening is formed within the ILD. The metal gate electrode is then filled within the opening. The gate-first and gate-last processes can be used to form metal gate complementary metal-oxide-semiconductor (CMOS) transistor.

A conventional metal gate CMOS transistor includes a metal gate PMOS transistor and a metal gate NMOS transistor. Both of the metal gate NMOS and PMOS transistors have n-type and p-type work function materials. Additionally, the metal gate PMOS transistor includes an n-type work function material disposed on the p-type work function material. The CMOS transistor uses aluminum (Al) as a conductive material for an electrical transmission.

It is found that Al can diffuse and/or penetrate into the p-type and n-type work function material and/or channel regions of the transistors. To prevent the Al diffusion, a diffusion barrier structure has been formed between the work function materials and Al. The conventional diffusion barrier consists of a titanium nitride (TiN) layer and a titanium (Ti) layer. The conventional diffusion barrier can have a thickness of about 180 Å for preventing the Al diffusion into the p-type and n-type work function materials and/or channel regions of the transistors.

As noted, the conventional gate-last process removes the dummy gates for forming recesses for accommodating the metal gate electrodes. The work function material, the diffusion barrier, and Al are sequentially formed within the recesses. The work function material and the diffusion barrier are formed on the sidewalls of the recesses as well as the bottom of the recesses. The work function material and the diffusion barrier formed on the sidewalls reduce the opening width of the recesses for the Al filling. If the fabrication technique shrinks, e.g., about 25 nm or less, it is found difficult to fill Al within the narrow recesses.

Additionally, it is found that the PMOS transistor also uses the p-type work function material to reduce the Al diffusion. Conventionally, the p-type work function material has a thickness of about 150 Å. The thick p-type work function material on the sidewalls of the recesses further reduces the opening width of the recesses for the Al filling and makes the Al filing more difficult.

Based on the foregoing, metal gate transistors, integrated circuits, systems, and fabrication methods thereof are desired.

It is understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.)

are used for ease of the present disclosure of one features relationship to another feature. The spatially relative terms are intended to cover different orientations of the device including the features.

FIG. 1 is a schematic cross-sectional view illustrating an exemplary integrated circuit including a P-type transistor and an N-type transistor. In FIG. 1, an integrated circuit 100 can include an N-type transistor 100a and a P-type transistor 100b disposed over a substrate 101. In some embodiments, the integrated circuit 100 can include a CMOS transistor, a memory array, a logic circuit, a digital circuit, an analog circuit, other circuits, and/or combinations thereof.

The substrate 101 can include an elementary semiconductor including silicon or germanium in crystal, polycrystalline, or an amorphous structure; a compound semiconductor including silicon carbide, gallium arsenic, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; or combinations thereof. In one embodiment, the alloy semiconductor substrate may have a gradient SiGe feature in which the Si and Ge composition change from one ratio at one location to another ratio at another location of the gradient SiGe feature. In another embodiment, the alloy SiGe is formed over a silicon substrate. In another embodiment, a SiGe substrate is strained. Furthermore, the semiconductor substrate may be a semiconductor on insulator, such as a silicon on insulator (SOI), or a thin film transistor (TFT). In some examples, the semiconductor substrate may include a doped epi layer or a buried layer. In other examples, the compound semiconductor substrate may have a multilayer structure, or the substrate may include a multilayer compound semiconductor structure.

Referring to FIG. 1, the integrated circuit 100 can include a P-well region 102 and an N-well region 103 formed within the substrate 101. The P-well region 102 and the N-well region 103 can be configured to provide channel regions of the N-type transistor 100a and the P-type transistor 100b, respectively.

The integrated circuit 100 can include an isolation structure 104 disposed between the N-type transistor 100a and the P-type transistor 100b. The isolation structure 104 can insulate the N-type transistor 100a from the P-type transistor. In some embodiments, the isolation structure 104 can be a shallow trench isolation (STI) structure, a local oxidation of silicon (LOCOS) structure, or other isolation structure.

In some embodiments, the P-type transistor 100b can include silicon-germanium (SiGe) structure 105a and 105b disposed adjacent to p-type source/drain regions 107a and 107b, respectively. The p-type source/drain regions 107a and 107b can be disposed adjacent to the channel region of the P-type transistor 100b. The N-type transistor 100a can include n-type source/drain regions 106a and 106b disposed adjacent to the channel region of the N-type transistor 100a.

In some embodiments, the n-type source/drain regions 106a and 106b can have dopants such as Arsenic (As), Phosphorus (P), other group V element, or the combinations thereof. The p-type source/drain regions 107a and 107b can have dopant such as Boron (B) or other group III element. In other embodiments, the source/drain regions can include silicide for low resistances. The silicide may comprise materials such as nickel silicide (NiSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), other suitable materials, and/or combinations thereof. The materials utilized to create the silicide may be deposited using PVD such as sputtering and evaporation; plating; CVD such as plasma enhanced CVD (PECVD), atmospheric pressure CVD (APCVD), low pressure CVD (LPCVD), high density plasma CVD (HDPCVD) and atomic layer CVD (ALCVD); other suitable deposition processes; and/or combinations thereof. After deposition, the salicidation process may continue with a reaction between the deposited material and the doped regions at an elevated temperature that is selected based on the specific material or materials. This is also referred to as annealing, which may include an RTP. The reacted silicide may be formed by a one-step RTP or multiple-step RTPs.

Referring again to FIG. 1, at least one dielectric layer 108 can be disposed over the substrate 101. The dielectric layer 108 may include materials such as oxide, nitride, oxynitride, low dielectric constant (low-k) dielectric material, ultra low-k dielectric material, extreme low-k dielectric material, other dielectric material, and/or combinations thereof. The dielectric layer 108 may be formed by, for example, a CVD process, a high density plasma CVD (HDP CVD) process, a high aspect ratio process (HARP), a spin-coating process, other deposition process, and/or any combinations thereof. In some embodiments, the dielectric layer 108 can be referred to as an interlayer dielectric (ILD). In other embodiments, additional dielectric layer (not shown) can be formed below or over the dielectric layer 108.

In some embodiments, spacers 109a and 109b can be disposed adjacent to gate structures of the N-type transistor 100a and the P-type transistor 100b, respectively. The spacers 109a and 109b may include materials such as oxide, nitride, oxynitride, and/or other dielectric material.

The N-type transistor 100a can include a gate dielectric structure 110a disposed over a substrate 101. An n-type work function metallic layer 130a can be disposed over the gate dielectric structure 110a. The n-type work function metallic layer 130a can be configured to adjust a work function value of the gate electrode of the N-type transistor 100a. A silicide structure 140a can be disposed over the n-type work function metallic layer 130a. The silicide structure 140a can be spaced from the gate dielectric structure 110a and substantially free from adjusting the work function value of the gate electrode of the N-type transistor 100a. In some embodiments using a 25-nm technique, the silicide structure 140a can be spaced from the gate dielectric structure 110a by a distance of about 30 Å or more.

The P-type transistor 100b can include a gate dielectric structure 110b disposed over the substrate 101. A p-type work function metallic layer 120 can be disposed over the gate dielectric structure 110b. The p-type work function metallic layer 120 can be configured to adjust a work function value of the gate electrode of the P-type transistor 100b. An n-type work function metallic layer 130b can be disposed over the p-type work function metallic layer 120. A silicide structure 140b can be disposed over the n-type work function metallic layer 130b. The silicide structure 140b can be spaced from the gate dielectric structure 110b and substantially free from adjusting the work function value of the gate electrode of the P-type transistor 100b. In some embodiments using a 25-nm technique, the silicide structure 140b can be spaced from the gate dielectric structure 110b by a distance of about 30 Å or more.

In some embodiments, the P-type transistor 110b can be free from including the n-type work function metallic layer 130b. In at least one embodiment having no n-type work function metallic layer 130b, the P-type transistor 110b can include the p-type work function metallic layer 120 only for adjusting the work function value of the gate electrode of the P-type transistor 110b.

Referring again to FIG. 1, each of the gate dielectric structures 110a and 110b can be a single layer or a multi-layer structure. In some embodiments, each of the gate dielectric structures 110a and 110b can include an interfacial layer, e.g., a silicon oxide layer and a high-k dielectric layer disposed over the interfacial layer. In some embodiments, the high-k dielectric layer may include hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), other suitable high-k dielectric materials, and/or combinations thereof. The high-k material may further be selected from metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina ($HfO_2$—$Al_2O_3$) alloy, other suitable materials, and/or combinations thereof. The high-k dielectric layer may be formed by any suitable process, such as atomic layer deposition (ALD), chemical vapor deposition (CVD), physical vapor deposition (PVD), remote plasma CVD (RPCVD), plasma enhanced CVD (PECVD), metal organic CVD (MOCVD), sputtering, plating, other suitable processes, and/or combinations thereof.

The p-type work function metallic layer 120 can include materials such as metal, metal carbide, metal nitride, or other materials that can provide a desired work function for transistors. In some embodiments, the p-type work function metallic layer 120 can include a material such as ruthenium, palladium, platinum, cobalt, nickel, or conductive metal oxides, e.g., ruthenium oxide, other p-type metallic material that is capable of modulating the work function value of the gate electrode of the P-type transistor 103, or the combinations thereof. In some other embodiments, the p-type work function metallic layer 120 can include TiN. The p-type work function metallic layer 120 is capable of providing a work function value of about 4.8 eV or more for the gate electrode of the P-type transistor 100b. In some embodiments, the p-type work function metallic layer 120 can have a bottom thickness "a" of about 100 Å or more. In some other embodiments using a 25-nm technique, the p-type work function metallic layer 120 can have a bottom thickness "a" of about 30 Å.

The n-type work function metallic layers 130a and 130b can include materials such as metal, metal carbide, metal nitride, or other materials that can provide a desired work function for transistors. In some embodiments, the n-type work function metallic layers 130a and 130b can include materials such as hafnium, zirconium, titanium, tantalum, aluminum, metal carbides, other n-type metallic material that is capable of modulating the work function value of the gate electrode of the N-type transistor 102, or the combinations thereof. In some other embodiments, the n-type work function metallic layers 130a and 130b can include TiAl. The n-type work function metallic layer 130a is capable of providing a work function value of about 4.5 eV or less for the N-type transistor 100a. In some embodiments, the n-type work function metallic layer 130a can have a bottom thickness "b" of about 30 Å.

Referring again to FIG. 1, the silicide structures 140a and 140b can be configured to provide an electrical transmission. The silicide structures 140a and 140b can include silicide lines, silicide bulks, silicide plug, and/or other shape of silicide. In some embodiments, a substantially whole portion of each of the silicide structures 140a and 140b is a silicide material. As noted, the silicide structures 140a and 140b can be desirably spaced from the gate dielectric structures 110a and 110b, respectively. The work functions of the N-type transistor 100a and the P-type transistor 100b can be substantially free from being affected and/or adjusted by the silicide structures 140a and 140b, respectively.

In some embodiments, the silicide structures 140a and 140b may comprise materials such as nickel silicide (NiSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), other suitable materials, and/or combinations thereof. The materials utilized to create the silicide may be deposited using PVD such as sputtering and evaporation; plating; CVD such as plasma enhanced CVD (PECVD), atmospheric pressure CVD (APCVD), low pressure CVD (LPCVD), high density plasma CVD (HDPCVD) and atomic layer CVD (ALCVD); other suitable deposition processes; and/or combinations thereof. After deposition, the salicidation process may continue with a reaction between the deposited material and the doped regions at an elevated temperature that is selected based on the specific material or materials. This is also referred to as annealing, which may include a RTP. The reacted silicide may be formed by a one-step RTP or multiple-step RTPs.

It is noted that the structure described above in conjunction with FIG. 1 is merely exemplary. An interconnect structure (not shown) can be formed over the dielectric layer 108 for an electrical connection. The interconnect structure can include various dielectric materials, via structures, metallic lines, single damascene structure, dual damascene structure, passivation, other desired semiconductor structure, and/or combinations thereof.

As noted, the conventional metal gate CMOS transistor uses Al as a gate electrode bulk for an electrical transmission. Al may diffuse into the p-type work function material and/or channel regions of the CMOS transistor. The conventional metal gate CMOS transistor uses the diffusion barrier, e.g., TiN and Ti, to prevent Al diffusion and/or penetration into the p-type work function material and/or channel regions of the transistors.

In contrary to the conventional metal gate CMOS transistor, the integrated circuit 100 uses the silicide structure 140a and 140b instead of Al as the metal bulk for the electrical transmission. By free from using Al as the conductive material, the Al diffusion can be substantially eliminated. The integrated circuit 100 can be free from including a diffusion barrier, e.g., Ti and/or TiN, between the work function metallic layer 130a and 130b and the silicide structures 140a and 140b, respectively.

FIGS. 2A-2L are schematic cross-sectional views illustrating an exemplary process flow for forming a gate-last CMOS transistor. Items of FIGS. 2A-2L that are the same items in FIG. 1 are indicated by the same reference numerals, increased by 100.

Figure 2A:
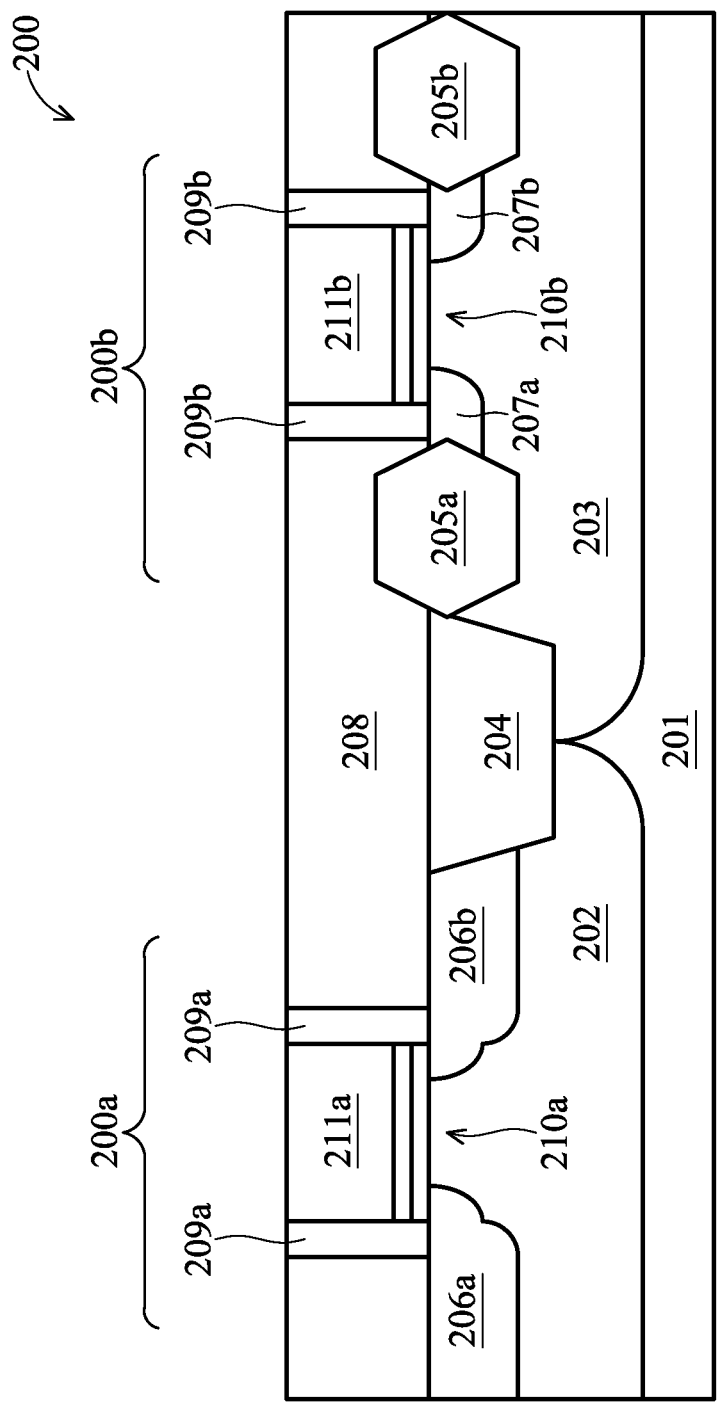
FIGS. 2A-2L are schematic cross-sectional views illustrating an exemplary gate-last process flow for forming an integrated circuit including a CMOS transistor.

Referring to FIG. 2A, dummy gates 211a and 211b can be formed over gate dielectric structures 210a and 210b, respectively. In some embodiments, the dummy gates 211a and 211b can include materials such as silicon, polysilicon, amorphous silicon, and other material that has a desired etch rate with respect to a dielectric material 208 and spacers 209a and 209b. The dummy gates 211a and 211b can be formed by deposition, photolithography patterning, etching processes, and/or combinations thereof. The deposition processes may include CVD, ALD, other suitable methods, and/or combinations thereof. The photolithography patterning processes may include photoresist coating (e.g., spin-on coating), soft baking, mask aligning, exposure, post-exposure baking, developing the photoresist, rinsing, drying (e.g., hard baking), other suitable processes, and/or combinations thereof. The photolithography exposing process may also be implemented or replaced by other proper methods such as maskless photolithography, electron-beam writing, ion-beam writing, and/or molecular imprint. The etching processes may include dry etching, wet etching, and/or other etching methods (e.g., reactive ion etching). The etching process may also be either purely chemical (plasma etching), purely physical (ion milling), and/or combinations thereof.

Figure 2B:
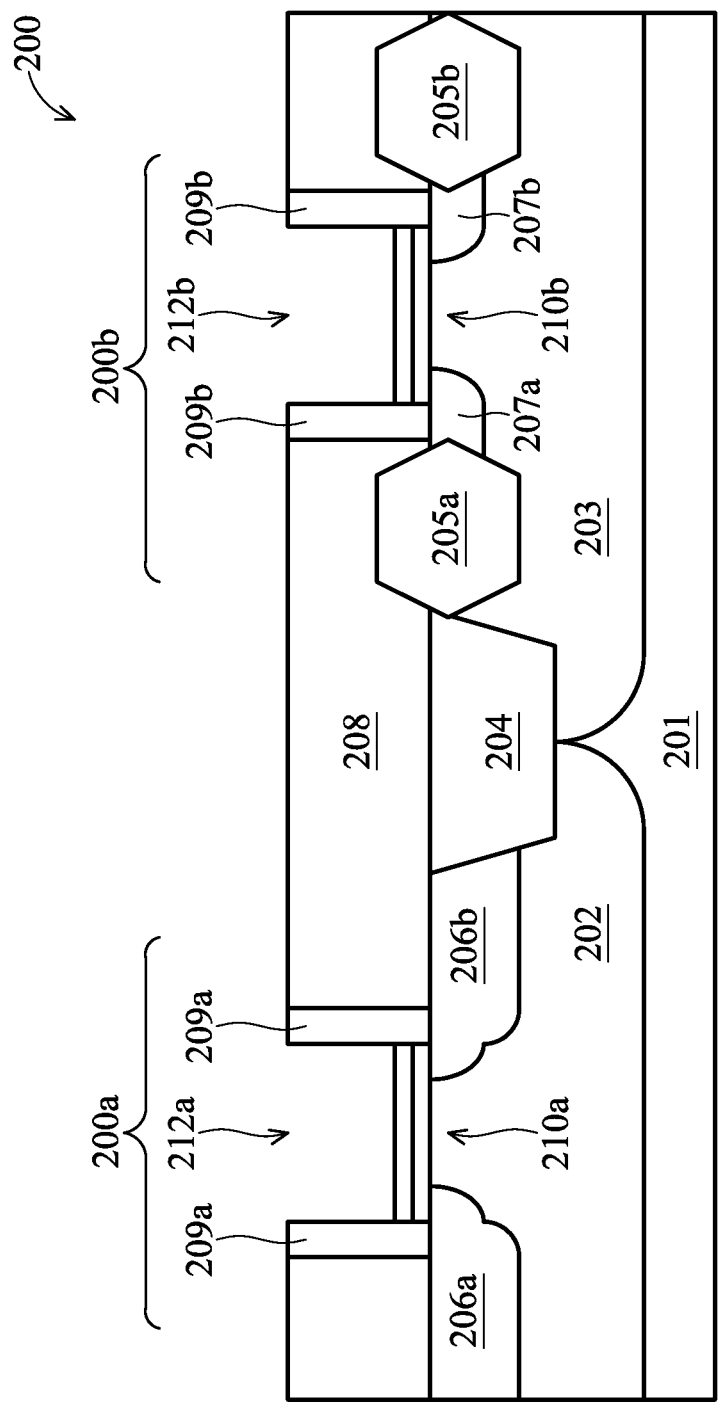

In FIG. 2B, the dummy gates 211a and 211b (shown in FIG. 2A) can be substantially removed to form openings 212a and 212b, respectively. In some embodiments, the dummy gates 211a and 211b can be removed by, for example, a wet etch process, a dry etch process, other removing process, and/or combinations thereof. In some embodiments, the gate dielectric structures 210a and 210b can include at least one cap layer (not shown) disposed over the high-k dielectric materials. The cap layer is capable of substantially protecting the high-k dielectric materials from being damaged by the process for removing the dummy gates 211a and 211b. In some embodiments, the cap layer can include materials such as TiN, TaN, other suitable material that can resist the removing process, and/or combinations thereof.

Figure 2C:
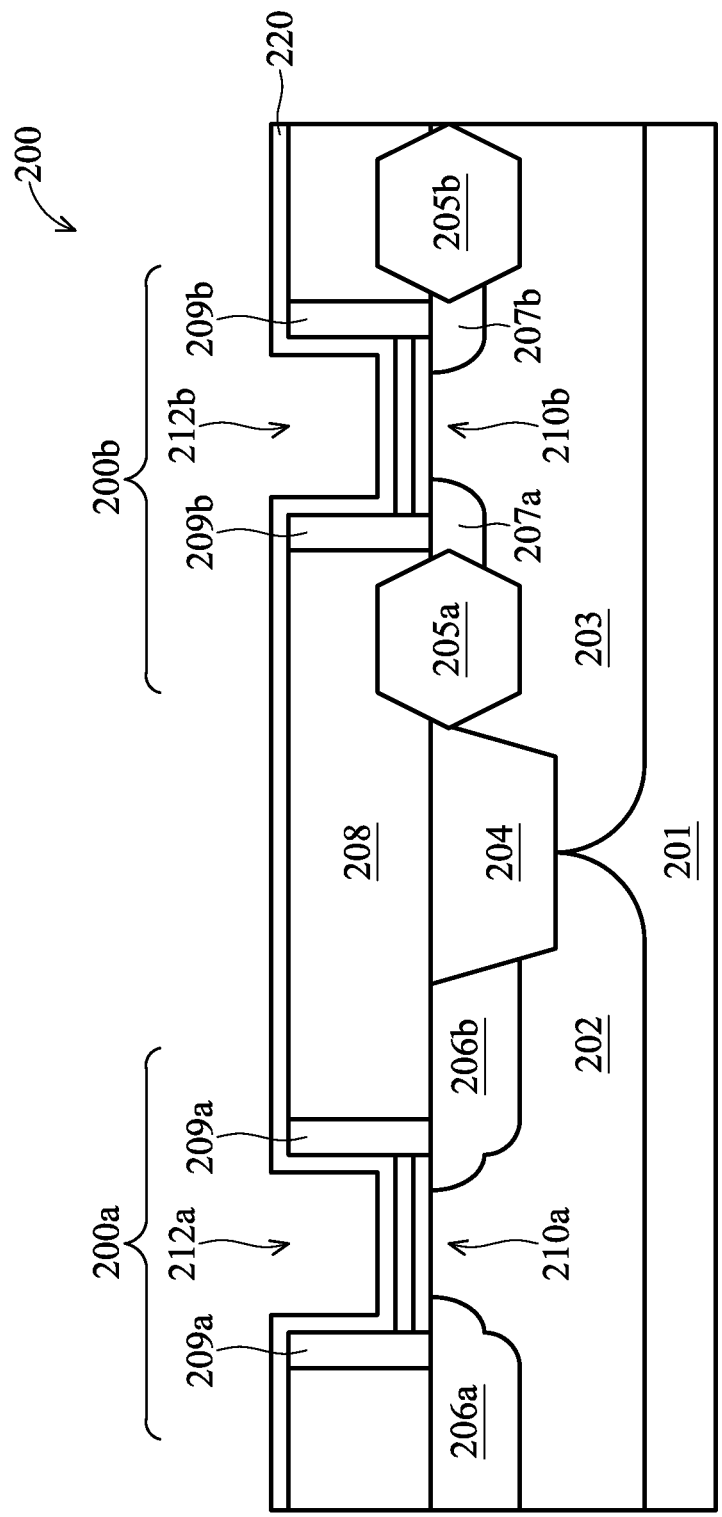

Referring to FIG. 2C, a p-type work function material 220 can be formed over the structure shown in FIG. 2B. The p-type work function material 220 can provide a desired work function value for the gate electrode of the P-type transistor 200b. The p-type work function material 220 can be formed by any suitable process, such as atomic layer deposition (ALD), chemical vapor deposition (CVD), physical vapor deposition (PVD), remote plasma CVD (RPCVD), plasma enhanced CVD (PECVD), metal organic CVD (MOCVD), sputtering, plating, other suitable processes, and/or combinations thereof.

Figure 2D:
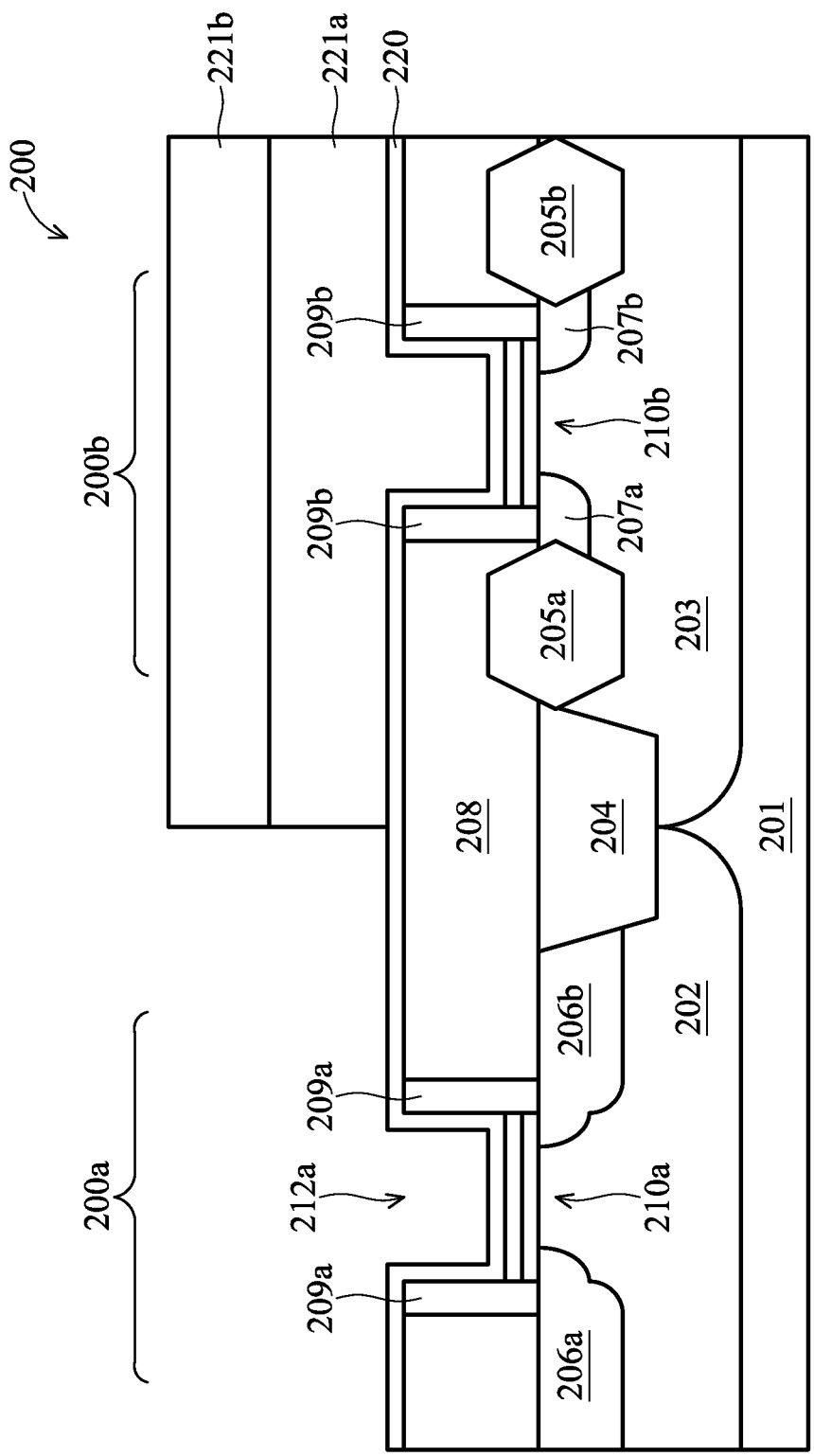

In FIG. 2D, a dielectric material 221a, e.g. spin-on-glass (SOG), can be formed, covering the region of the P-type transistor 200b and filling the opening 212b (shown in FIG. 2C). A photoresist 221b can be defined over the dielectric material 221a. The dielectric material 221a and/or the photoresist 221b can be provided for patterning the p-type work function material 220 for the P-type transistor 200b. The dielectric material 221a and the photoresist 221b can be defined by, for example, a spin-on process, a photolithographic process, and/or an etch process.

Figure 2E:
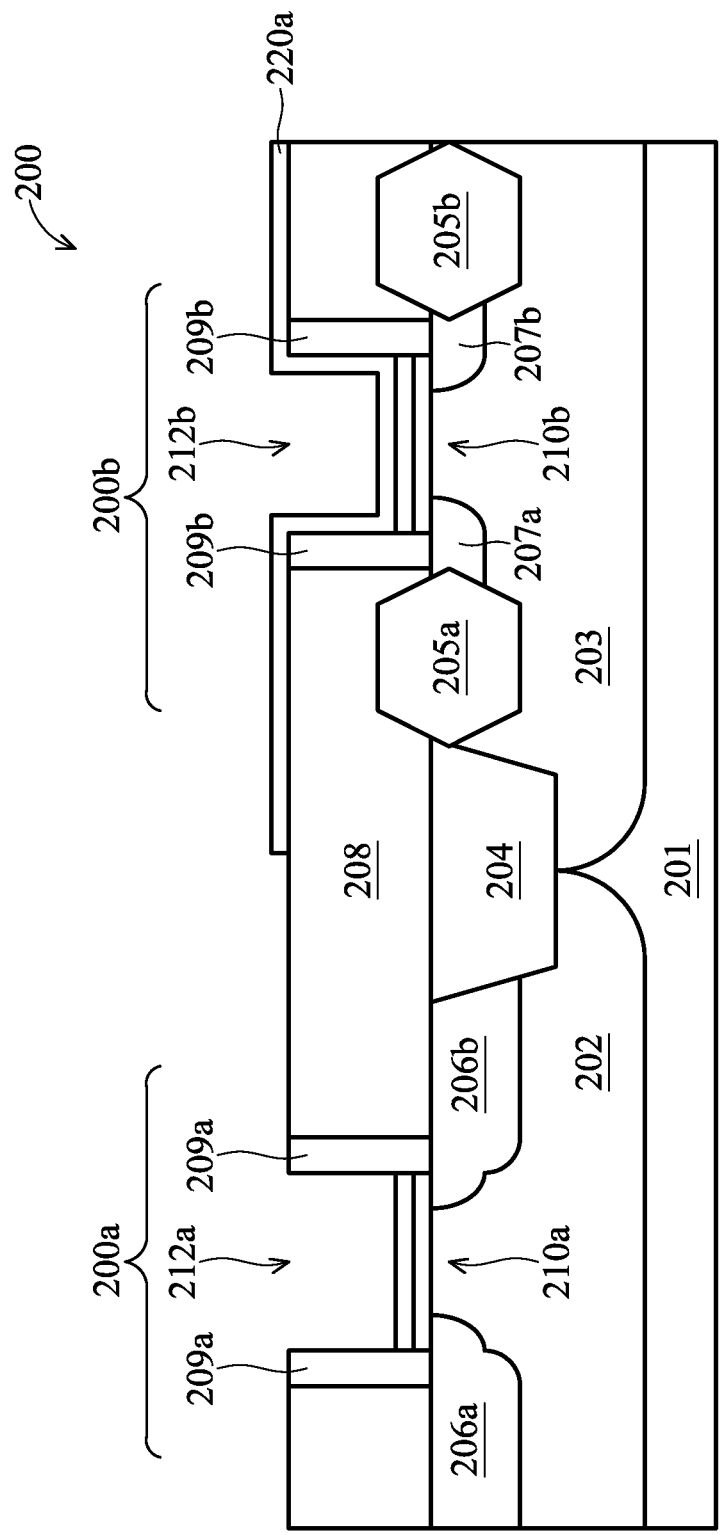

In FIG. 2E, a portion of the p-type work function material 220 that is not covered by the dielectric material 221a and the photoresist 221b (shown in FIG. 2D) can be removed, defining the p-type work function metallic layer 220a. After defining the p-type work function metallic layer 220a, the dielectric material 221a and the photoresist 221b can be removed by a wet etch process, a dry etch process, and/or combinations thereof, exposing the p-type work function metallic layer 220a.

Figure 2F:
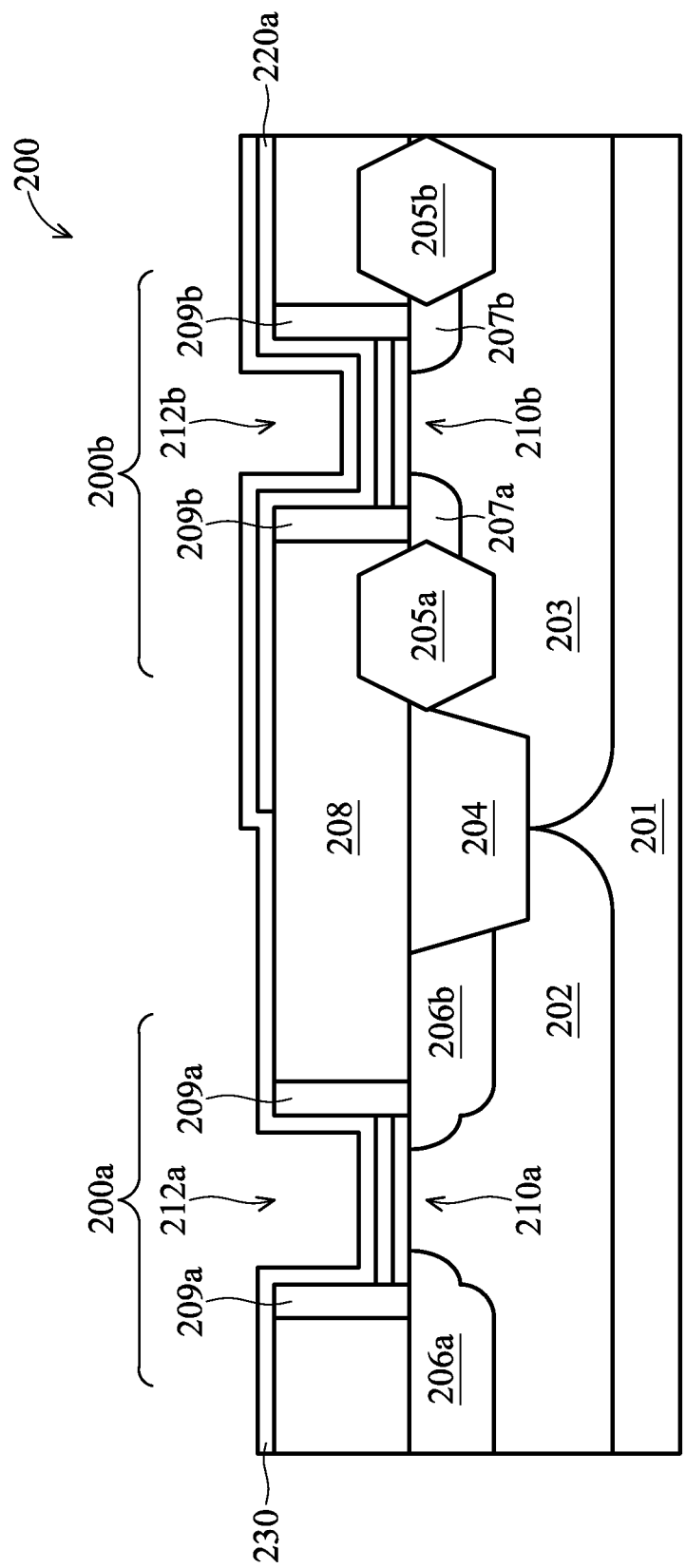

In FIG. 2F, an n-type work function material 230 can be formed over the structure shown in FIG. 2E. The n-type work function material 230 can provide a desired work function value for the gate electrode of the N-type transistor 200a. The n-type work function material 230 can be formed by any suitable process, such as atomic layer deposition (ALD), chemical vapor deposition (CVD), physical vapor deposition (PVD), remote plasma CVD (RPCVD), plasma enhanced CVD (PECVD), metal organic CVD (MOCVD), sputtering, plating, other suitable processes, and/or combinations thereof.

Figure 2G:
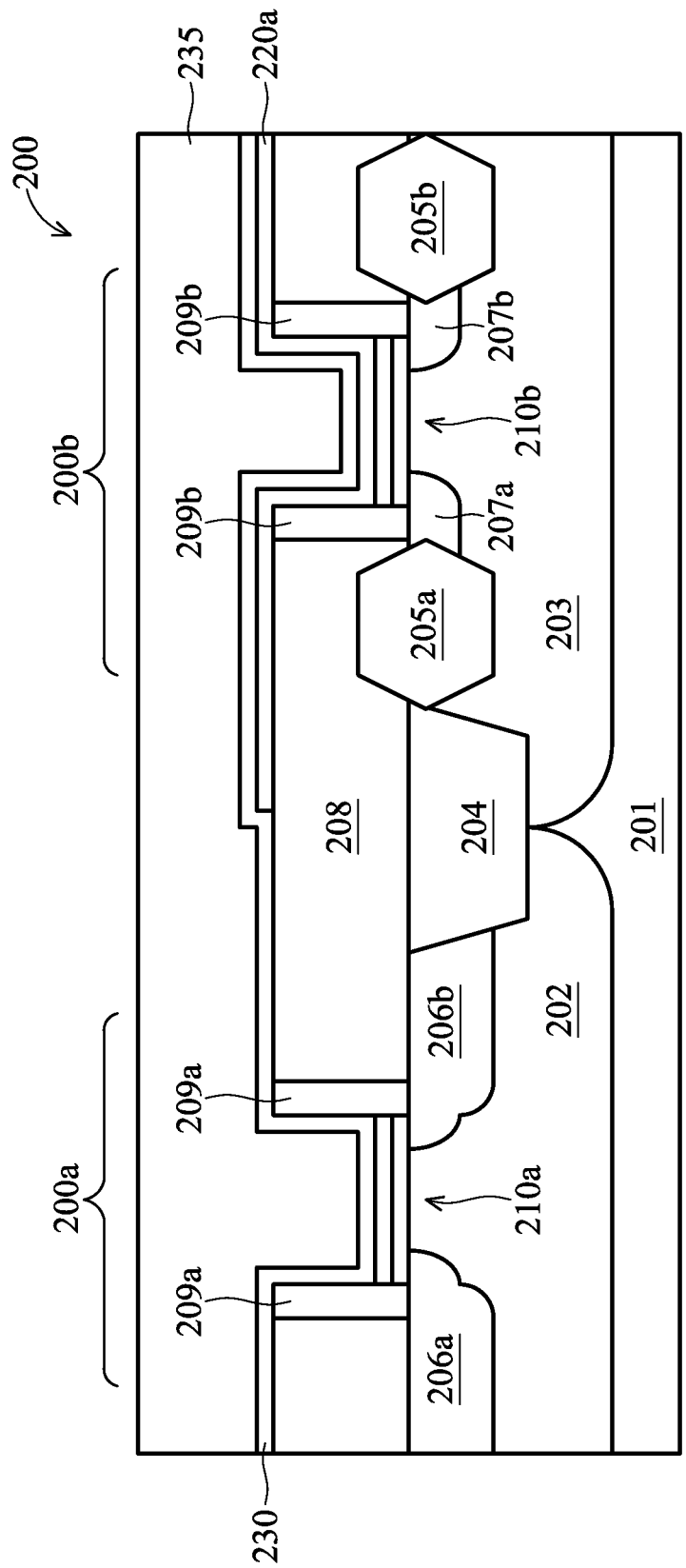

In FIG. 2G, a silicon material 235, e.g., polysilicon or amorphous silicon, can be formed over the n-type work function material 230, filling the openings 212a and 212b (shown in FIG. 2F). The silicon material 235 can be formed by a CVD process such as high-density plasma CVD (HDPCVD), atomic layer CVD (ALCVD), or the like.

Figure 2H:
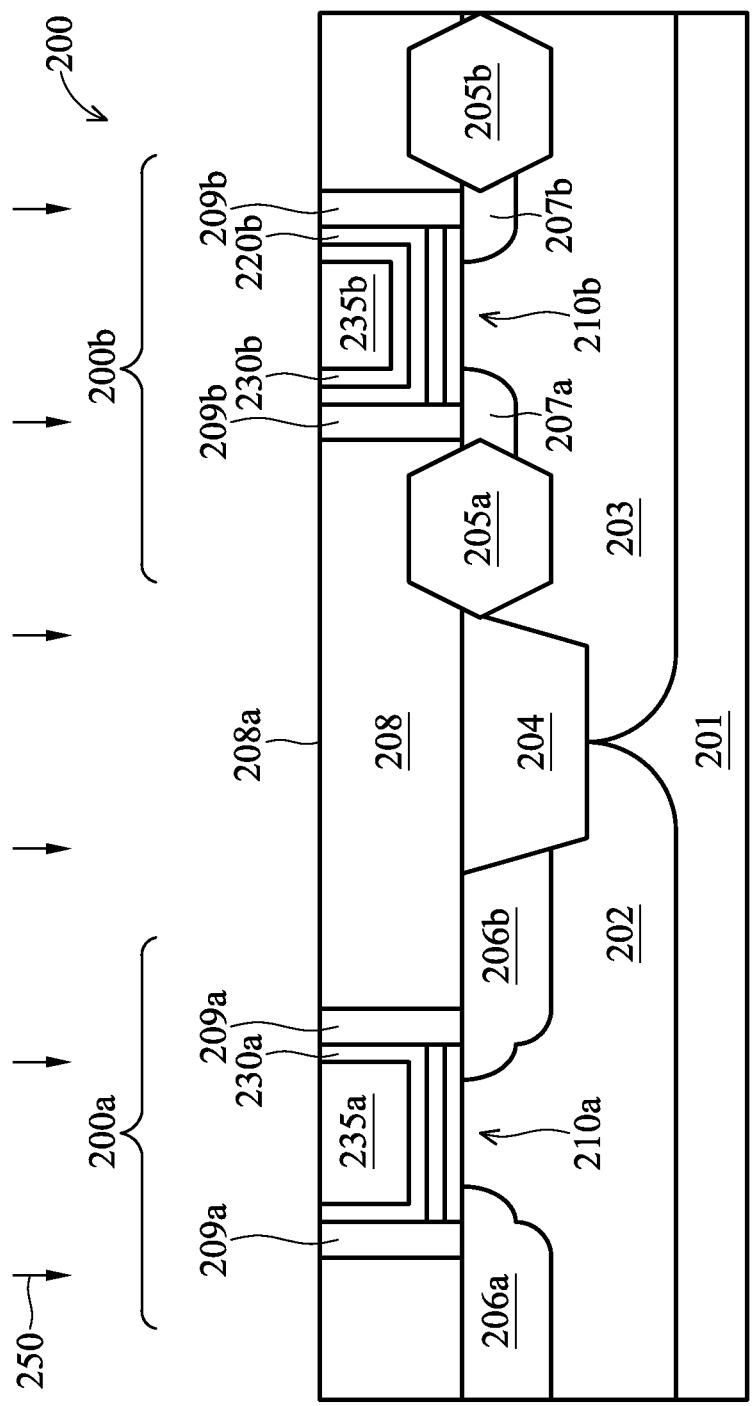

In FIG. 2H, a removing process 250 can remove a portion of the silicon material 235 such that top surfaces (not labeled) of silicon bulks 235a and 235b can be substantially level with a top surface 208a of the dielectric material 208. The removing process 250 can include a chemical-mechanical polish (CMP) process, a dry etch process, a wet etch process, and/or combinations thereof.

Figure 2I:
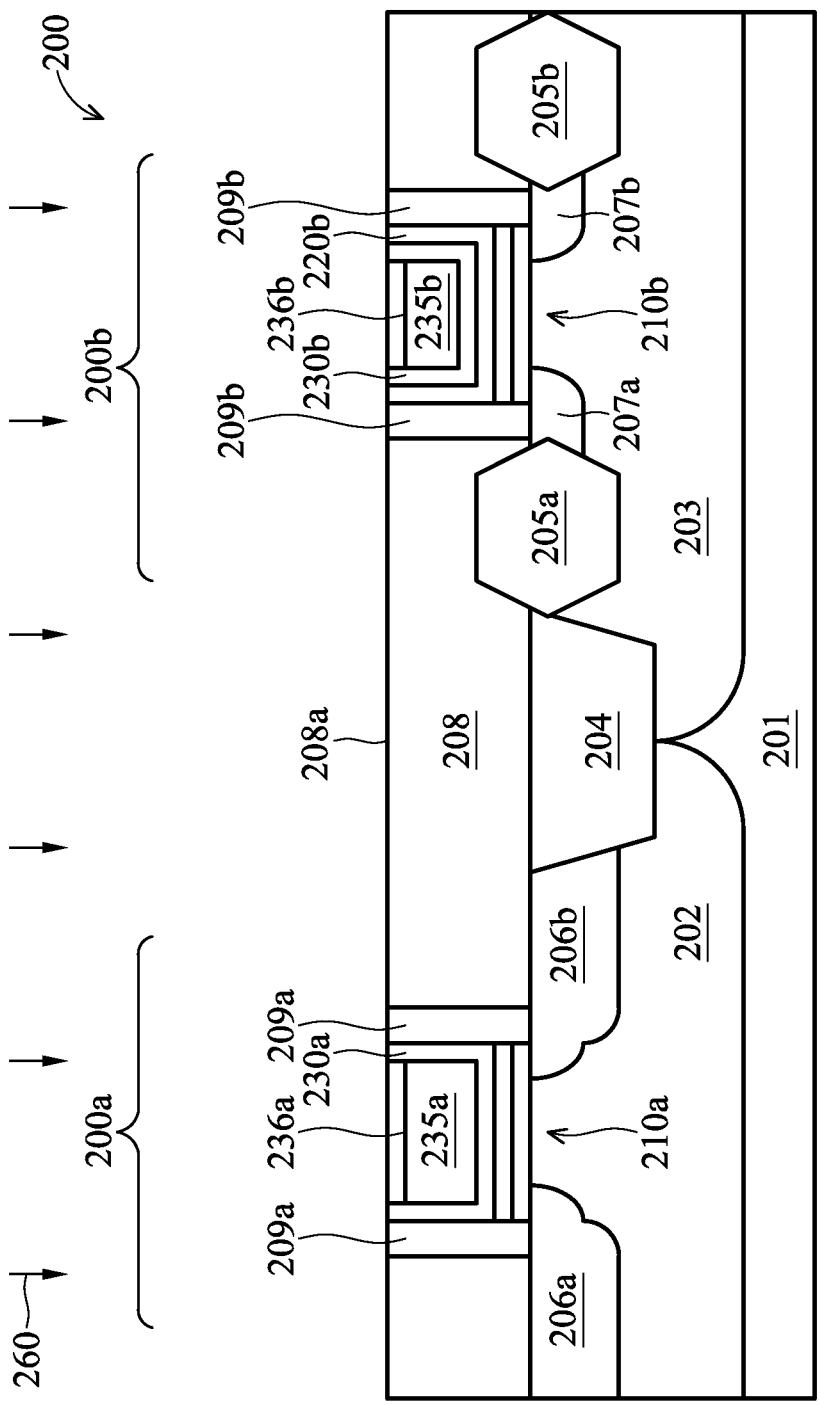

In FIG. 2I, a removing process 260 can recess portions of the silicon bulks 235a and 235b such that top surfaces 236a and 236b of the silicon bulks 235a and 235b, respectively, can be lower than the top surface 208a of the dielectric material 208 by a predetermined distance. In some embodiments, the predetermined distance, i.e., a step height between the top surfaces 236a and 208a, can be about a half of the height of the silicon bulk 235a (shown in FIG. 2I). The removing process 260 can include, for example, a dry etch process.

Figure 2J:
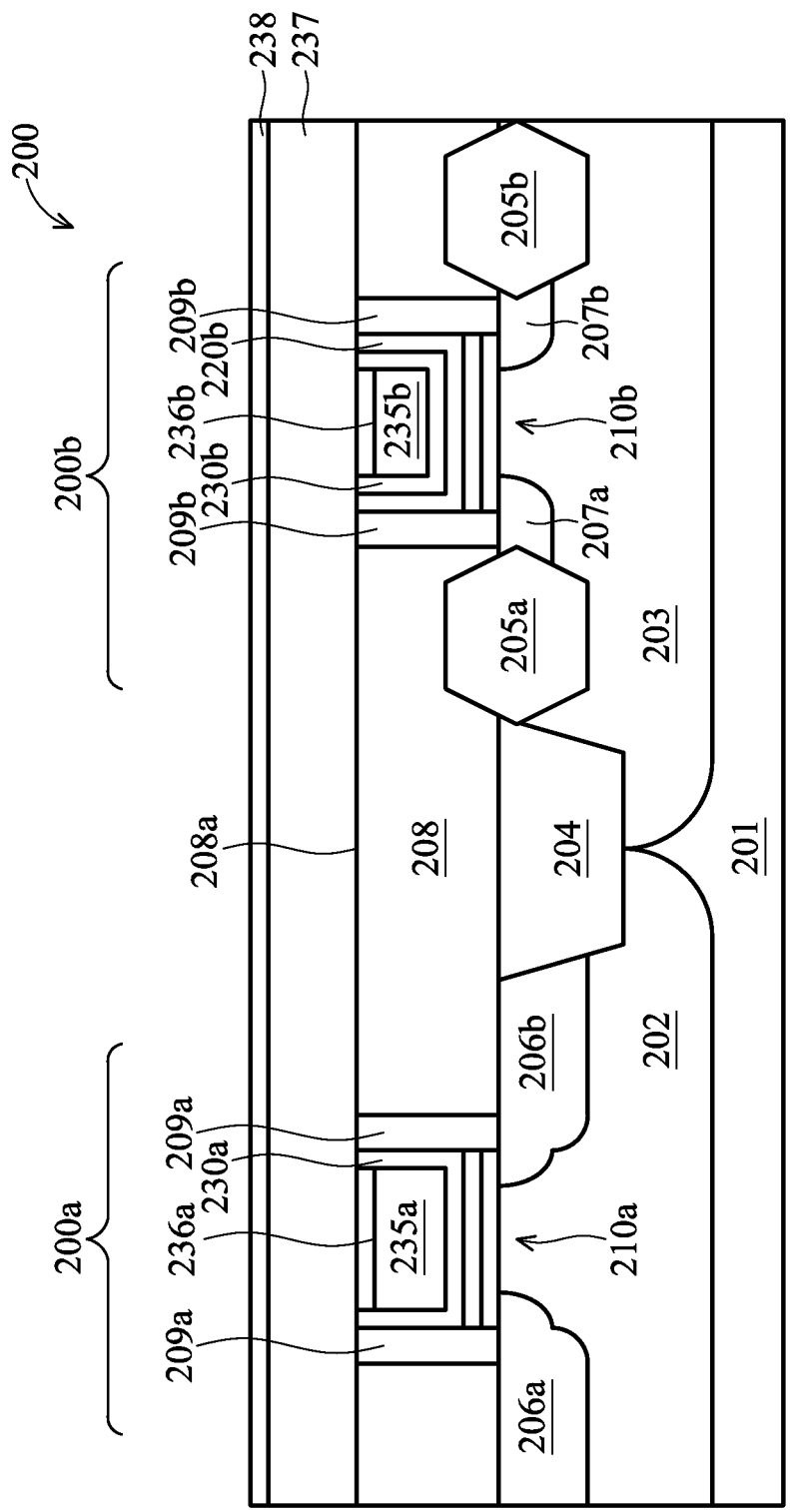

Referring to FIG. 2J, a metallic material 237 and a cap layer 238 can be sequentially formed over the silicon bulks 235a and 235b and the dielectric material 208. The metallic material 237 may comprise materials such as nickel silicide (NiSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), other suitable materials, and/or combinations thereof. The metallic material 237 utilized to create a silicide structure may be deposited using PVD such as sputtering and evaporation; plating; CVD such as plasma enhanced CVD (PECVD), atmospheric pressure CVD (APCVD), low pressure CVD (LPCVD), high density plasma CVD (HDPCVD) and atomic layer CVD (ALCVD); other suitable deposition processes; and/or combinations thereof. The cap layer 238 can include materials such as TiN, TaN, other suitable conductive material, and/or combinations thereof. The cap layer 238 may be formed by CVD, PVD, ALD, and/or other suitable process.

Figure 2K:
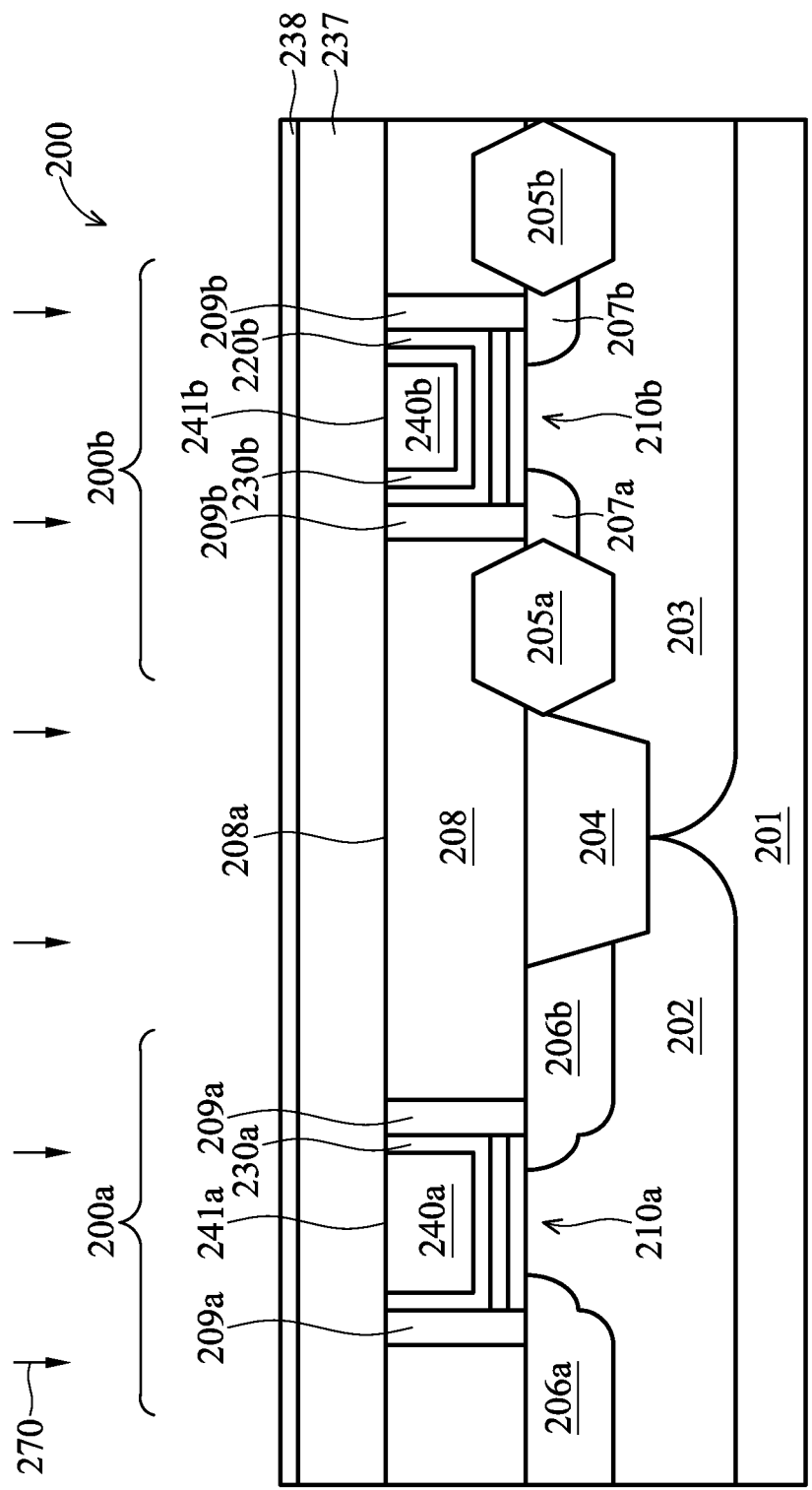

In FIG. 2K, a thermal process 270 can react the metallic material 237 with the silicon bulks 235a and 235b (shown in FIG. 2J) to form silicide structures 240a and 240b. In some embodiments, the thermal process 270 may react substantially whole portions of the silicon bulks 235a and 235b with the metallic material 237, forming the silicide structures 240a and 240b. The thermal process 270 can be performed at an elevated temperature that is selected based on the metallic material 237. In some embodiments, the thermal process 270 can be referred to as annealing, which may include a RTP. The reacted salicide may be formed by a one step RTP or multiple step RTPs.

The silicide structures 240a and 240b can be conductive bulks of the metal gates of the N-type transistor 200a and P-type transistor 200b, providing an electrical transmission. Due to the recesses of the silicon bulks 235a and 235b, top surfaces 241a and 241b of the silicide structures 240a and 240b can be substantially level with the top surface 208a of the dielectric material 208. It is noted that the metallic material 237 is substantially free from interacting with the dielectric material 208. Silicide is free from being formed between the dielectric material 208 and the metallic material 237. In some embodiments, the salicidation process including the processes described above in conjunction with FIGS. 2H-2K can be referred to as a selective salicidation process.

Figure 2L:
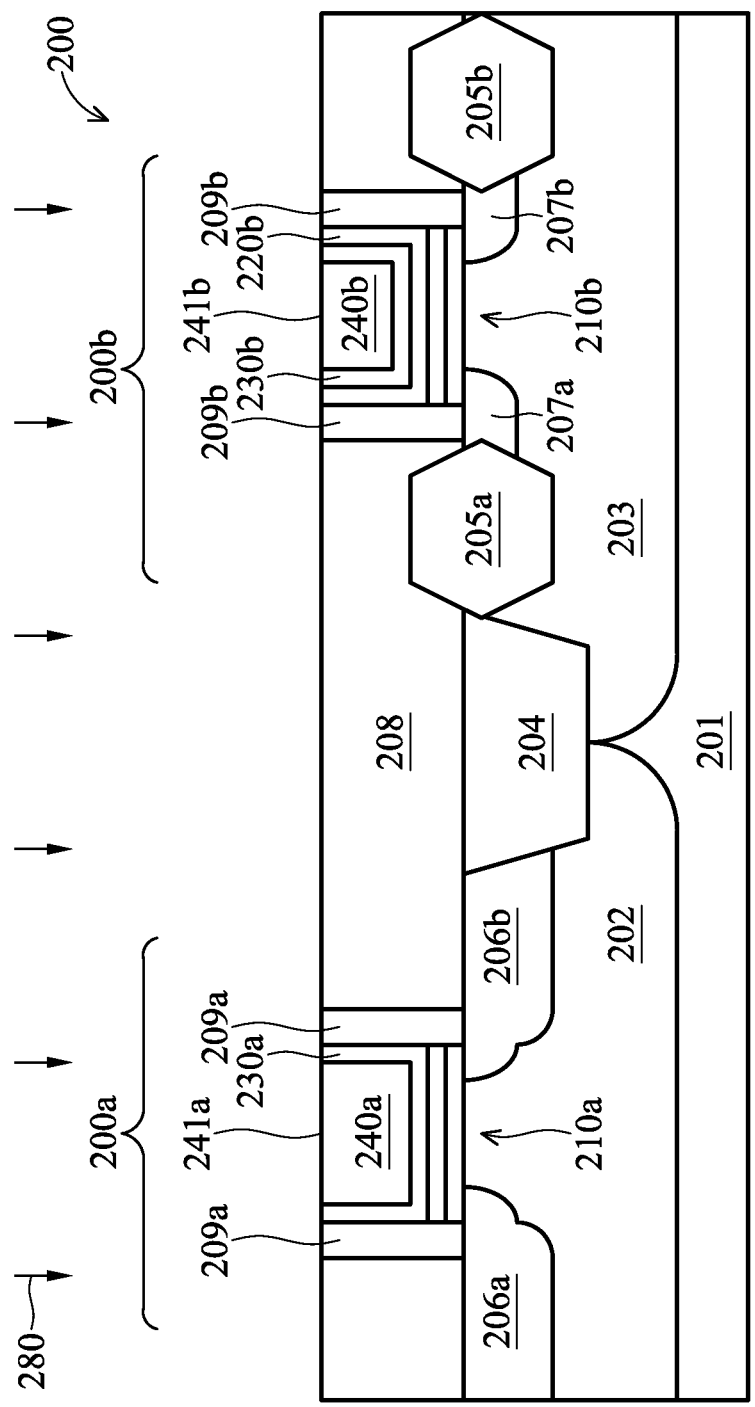

Referring to FIG. 2L, a removing process 280 can remove the cap layer 238 and the unreacted portion of the metallic material 237. The removing process 280 can include a wet etch process, a dry etch process, a CMP process, and/or any combinations thereof.

As noted, the method described above in conjunction with FIGS. 2A-2L can form the silicide structures 240a and 240b for the electrical transmission. The silicide structures 240a and 240b are substantially free from including Al. Since the method described above in conjunction with FIGS. 2A-2L can substantially eliminate the Al diffusion concern, the method is free from including a process forming a diffusion barrier for preventing Al diffusion.

Also noted, since the process for forming the diffusion barrier can be saved, the openings 212a and 212b (shown in FIG. 2F) can have desired widths to accommodate the silicon material 235 and/or the metallic material 237. Additionally, the silicon material 235 has a desired filling capability to fill in the openings 212a and 212b. The gate-last method described above in conjunction with FIGS. 2A-2L for the transistors can be desirably applied for the 25-nm or less technique.

It is found that since the concern of the Al diffusion is substantially reduced, the p-type work function metallic layer 220b can have a desired bottom thickness of about 100 Å or less. In embodiments, the p-type work function metallic layer 220b can have a desired bottom thickness of about 30 Å or less. Since the thickness of the p-type work function metallic layer 220b is reduced, the opening 212b (shown in FIG. 2F) can have desired widths to accommodate the silicon material 235 and/or the metallic material 237.

It is noted that the method described above in conjunction with FIGS. 2A-2L is merely exemplary. One of skill in the art can modify the flow of the method to achieve desired metal gate transistors. For example, the process forming and defining the dielectric material 221a can be saved if solely using the photoresist 221b to define the p-type work function metallic layer 220a is desired.

In some other embodiments, the P-type transistor 220b is free from including the n-type work function metallic layer 230b. In the embodiment having no n-type work function metallic layer 230b, additional photolithographic process, etch process, and/or cleaning process may be used to merely form the n-type work function metallic layer 230a in the N-type transistor 220a.

In still some other embodiments, the removing process 260 for recessing the silicon bulks 235a and 235b can be optionally. In the embodiment skipping the removing process 260, the top surfaces 241a and 241b of the silicide structures 240a and 240b, respectively, may extend over the top surface 208a of the dielectric material 208.

Figure 3:
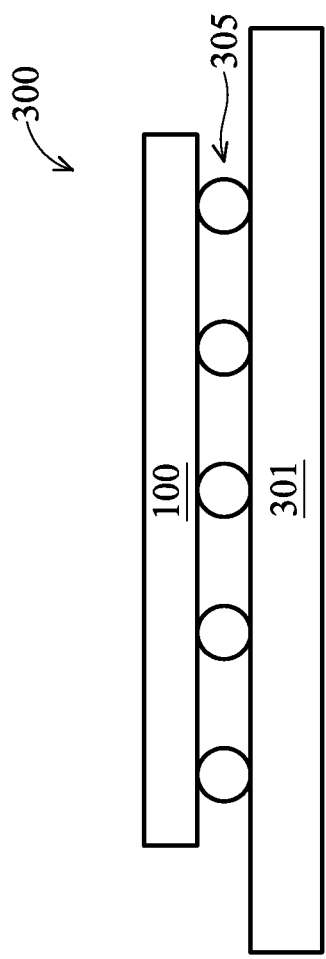
FIG. 3 is a schematic drawing illustrating a system including an exemplary integrated circuit disposed over a substrate board.

FIG. 3 is a schematic drawing illustrating a system including an exemplary integrated circuit disposed over a substrate board. In FIG. 3, a system 300 can include an integrated circuit 302 disposed over substrate board 301. The substrate board 301 can include a printed circuit board (PCB), a printed wiring board and/or other carrier that is capable of carrying an integrated circuit. The integrated circuit 302 can be similar to the integrated circuit 100 described above in conjunction with FIG. 1. The integrated circuit 302 can be electrically coupled with the substrate board 301. In some embodiments, the integrated circuit 302 can be electrically coupled with the substrate board 301 through bumps 305. In some other embodiments, the integrated circuit 302 can be electrically coupled with the substrate board 301 through wire bonding. The system 300 can be part of an electronic system such as computers, wireless communication devices, computer-related peripherals, entertainment devices, or the like.

In some embodiments, the system 300 including the integrated circuit 302 can provides an entire system in one IC, so-called system on a chip (SOC) or system on integrated circuit (SOIC) devices. These SOC devices may provide, for example, all of the circuitry needed to implement a cell phone, personal data assistant (PDA), digital VCR, digital camcorder, digital camera, MP3 player, or the like in a single integrated circuit.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A gate-last method for forming a metal gate transistor, the method comprising:
    forming a work function metallic layer within an opening and over a gate dielectric structure; and
    forming a silicide structure over the work function metallic layer,
    wherein the forming the silicide structure comprises:
        forming a silicon bulk within the opening;
        removing a portion of the silicon bulk to form a recess within the opening; and
        saliciding the silicon bulk with a metallic material to form the silicide structure.

2. The method of claim 1, wherein saliciding the silicon bulk with the metallic material includes saliciding a substantially whole portion of the silicon bulk with the metallic material.

3. The method of claim 1 wherein removing a portion of the silicon bulk to form a recess within the opening further comprises recessing a portion of the silicon bulk for a predetermined distance such that the forming the silicide structure is capable of forming the silicide structure having a top surface that is substantially level with a top surface of a dielectric material.

4. The method of claim 3, wherein the predetermined distance is about a half of a height of the silicon bulk.

5. The method of claim 1, wherein the saliciding the silicon bulk with the metallic material comprises a selective salicidation process.

6. The method of claim 1, wherein the method is free from including forming a diffusion barrier between the work function metallic layer and the silicide structure.

7. The method of claim 1, wherein the work function metallic layer has a bottom thickness of about 100 Å or less.

8. The method of claim 1, wherein the forming the silicide structure is performed to form the silicide structure comprising nickel silicide (NiSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), or cobalt silicide (CoSi).

9. A method for forming a transistor comprising:
   forming a dummy gate over a gate dielectric structure, the dummy gate and the gate dielectric structure being surrounded by a dielectric layer over a substrate;
   removing the dummy gate;
   forming a work function metallic layer over the gate dielectric structure;
   forming a silicon bulk over the work function metallic layer, a top surface of the silicon bulk being lower than a top surface of the dielectric layer; and
   saliciding the silicon bulk with a metallic material to form a silicide structure.

10. The method of claim 9, wherein the saliciding the silicon bulk comprises saliciding a substantially whole portion of the silicon bulk with the metallic material.

11. The method of claim 9, wherein the forming the silicon bulk comprises:
   depositing a silicon material over the work function metallic layer; and
   performing a dry etch process to recess the deposited silicon material.

12. The method of claim 11, wherein the depositing the silicon material comprises depositing polysilicon or amorphous silicon by a chemical vapor deposition process.

13. The method of claim 11, wherein the forming the silicon bulk further comprises performing a first removing process prior to performing the dry etch process.

14. The method of claim 9, wherein the saliciding the silicon bulk comprises:
   forming a layer of the metallic material over the silicon bulk; and
   performing a thermal process to cause reaction between the layer of the metallic material and the silicon bulk.

15. The method of claim 14, further comprising:
   forming a cap layer over the layer of the metallic material prior to the performing the thermal process.

16. The method of claim 14, further comprising:
   removing unreacted metallic material.

17. The method of claim 9, wherein the saliciding the silicon bulk is performed to form the silicide structure comprising nickel silicide (NiSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), or cobalt silicide (CoSi).

18. A method for forming a gate structure comprising:
   forming a gate dielectric structure, the gate dielectric structure being surrounded by a dielectric layer over a substrate;
   forming a silicon bulk over the gate dielectric structure;
   forming a layer of a metallic material over a top surface of the silicon bulk and a top surface of the dielectric layer, wherein the top surface of the silicon bulk is lower than the top surface of the dielectric layer; and
   saliciding the silicon bulk with the metallic material to form a silicide structure.

19. The method of claim 18, wherein the saliciding the silicon bulk comprises:
   performing a thermal process to cause reaction between the layer of the metallic material and the silicon bulk.

20. The method of claim 18, wherein the saliciding the silicon bulk is performed to form the silicide structure comprising nickel silicide (NiSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), or cobalt silicide (CoSi).

* * * * *